US006611933B1

(12) United States Patent
Koenemann et al.

(10) Patent No.: US 6,611,933 B1
(45) Date of Patent: Aug. 26, 2003

(54) REAL-TIME DECODER FOR SCAN TEST PATTERNS

(75) Inventors: Bernd Koenemann, San Jose, CA (US); Carl Barnhart, Tucson, AZ (US); Brion Keller, Conklin, NY (US)

(73) Assignee: International Business Machines Corporation, Armonk, NJ (US)

( * ) Notice: Subject to any disclaimer, the term of this patent is extended or adjusted under 35 U.S.C. 154(b) by 0 days.

(21) Appl. No.: 09/547,827

(22) Filed: Apr. 12, 2000

(51) Int. Cl.[7] .......................... G01R 31/28; G06F 11/00
(52) U.S. Cl. ....................... 714/726; 714/738
(58) Field of Search ................. 714/724–729, 714/738, 739

(56) References Cited

U.S. PATENT DOCUMENTS 6,219,811 B1 * 4/2001 Gruetzner et al. ............ 714/30
6,327,687 B1 * 12/2001 Rajski et al. ................ 714/738

FOREIGN PATENT DOCUMENTS

EP 0 481 097 B1 9/1990 ........... G06F/11/26

OTHER PUBLICATIONS

"Bit–Flipping BIST", Hans–Joachim Wunderlich and Gundolf Kiefer, published in ICCAD '96, pp. 337–346, 1996.
"Synthesis of Mapping Logic for Generating Transformed Pseudo–Random Patterns for BIST", N. A. Touba and E. J. McCluskey, published in 1995 International Test Conference, pp. 674–682.
"LFSR–Coded Test Patterns for Scan Designs", Dr. Bernd Koenemann, published at 1991 European Test Conference, pp. 237–242.
"Two–Dimensional Test Data Decompressor for Multiple Scan Designs", N. Zacharia et al., 1996 International Test Conference, pp. 186–194.

"LFSR Reseeding as a Component of Board Level BIST", Pieter M. Trouborst, 1996 International Test Conference, pp. 58–96.
"Scan Vector Compression/Decompression Using Statistical Coding", Abhijit Jas, et al., VTS '99, pp. 114–120.
"Test Data Decompression for Multiple Scan Designs With Boundary Scan" Rajski, et al. IEEE Transactions on Computers, vol.: 47 Issue: 11 , Nov. 1998 pp. 1188–1200.*
"Scan Vector Compression/Decompression Using Statistical Coding" Jas et al. VLSI Test Symposium, 1999. 17th IEEE Proceedings. pp. 114–120.*

* cited by examiner

Primary Examiner—Albert Decady
Assistant Examiner—Cynthia Britt
(74) Attorney, Agent, or Firm—H. Daniel Schnurmann

(57) ABSTRACT

A method and apparatus for improving the efficiency of scan testing of integrated circuits is described. This efficiency is achieved by reducing the amount of required test stimulus source data and by increasing the effective bandwidth of the scan-load operation. The reduced test data volume and corresponding test time are achieved by integrating a real-time test data decoder or logic network into each integrated circuit chip. The apparatus, servicing a plurality of internal scan chains wherein the number of said internal scan chains exceeds the number of primary inputs available for loading data into the scan chains, includes: a) logic network positioned between the primary inputs and the inputs of the scan chains, the logic network expanding input data words having a width corresponding to the number of the primary inputs, and converting the input data words into expanded output data words having a width that corresponds to the number of the internal scan chains; and b) coupled to the internal scan chains, registers loaded with bit values provided by the expanded output data words while data previously loaded into the scan chains shifts forward within the scan chains by one bit position at a time; wherein a first plurality of the input data words supplied to the primary inputs produce a second plurality of expanded data words that are loaded into the internal scan chains to achieve an improved test coverage.

16 Claims, 5 Drawing Sheets

FIG. 5

REAL-TIME DECODER FOR SCAN TEST PATTERNS

FIELD OF THE INVENTION

This invention is related to scan testing of complex digital circuits including integrated circuits (ICs), higher level assemblies and systems using ICs, and more particularly, to a method and apparatus for expanding test patterns applied to a restricted number of product primary inputs to inputs of a larger number of on-product scan chains for the purpose of scan testing.

BACKGROUND OF THE INVENTION

Scan testing of digital circuits, internal sequential or register elements, such as latches, and the like, scattered between combinatorial components are designed in a way that they can be connected to each other in several parallel shift registers called scan chains. The inputs of the scan chains are connected to primary inputs (PIs) of the product under test. Each scan test typically requires that the scan chains be completely loaded with new test data one or more times using a scan load-operation. This loading operation takes place prior to applying a test sequence that exercises the logic connected to the register elements. The scan chains are loaded by repeatedly supplying a binary input data word with one bit of information for each scan chain followed by the application of one scan clock cycle. In response to the scan clock cycle, information already in the scan chains is shifted by one bit position towards the end of each chain. At the same time, the new information bit supplied at each scan chain input is loaded into the respective register element closest to each scan chain input. The number of scan clock cycles and input data words needed for completely loading all the scan chains is, thus, determined by the number of register elements in the longest scan chain.

The scan chains operate as clocked serial shift registers that are serially loaded with test input data (test stimulus data) from a suitable test stimulus data source. The procedure used for loading the scan chains is referred to as a scan-load operation. Automatic Test Equipment (ATE) is the most prevalent source of test stimulus data used for testing integrated circuits (IC) chips and higher-level assemblies. Once the test stimulus data has been loaded into the scan chains, the circuit under test can be exercised. These, in turn, result in certain test responses that are captured by the internal register elements that form the scan chains. The captured responses are, then, serially unloaded to a suitable test response sink for comparison with expected responses. ATE is one of such test response sinks. The procedure used for unloading is referred to as a scan-unload operation Data to be loaded is stored in the ATE and transferred to the component under test by shifting the scan chains. The total number of register elements in the component under test determines the amount of data needed for one complete load. The length of the longest scan chain and the shift cycle time determine the time needed for a complete load.

In order to reduce test time, it is advantageous to implement a large number of shorter scan chains rather than a small number of long chains. It should be noted that the use of more scan chains does not reduce by itself the total number of register elements and, hence, does not reduce the amount of data needed for a complete load. Furthermore, some scan tests may require more than one complete load to achieve fault detection. Hence, the total number of loads may exceed the number of tests in the full test program that must be applied to achieve the desired test coverage.

The number of register elements in modern ICs can exceed several hundred thousands. Thousands of scan tests-must be applied to achieve a good test coverage. In aggregate, the total amount of test data needed for a full test program begins to reach the limits of buffer storage available on a typical ATE used for a manufacturing test, even if the ATE is equipped with a dedicated scan buffer memory. Furthermore, typical ATEs often limit the maximum number of scan chains and the shift cycle rate. The fixed width and bandwidth of the scan interface result in longer scan chains and increased test time as the complexity of ICs grows with every new technology generation.

In conventional scan testing, test stimulus data is stored in ready-to-apply form in a high-speed buffer memory within the ATE and is directly loaded into the scan chains without additional data transformations. ATE architectures typically constrain the maximum of amount scan buffer memory available for scan test stimulus data, the maximum number of scan chains that can be serviced in parallel from a scan buffer memory, and the maximum cycle rate at which the data can be loaded into the scan chains. In other words, an ATE is characterized by a limited scan buffer space and a fixed, narrow bandwidth for transferring scan test stimulus data from ATE to the circuit under test.

Experience teaches that the number of register elements in a digital network grows proportionally with the size of the network, and that the number of tests also increases with network size. Consequently, the total amount of test stimulus data tends to grow more than linearly with network size and continuously threatens to exceed the buffer memory of installed ATEs, as new technology generations are introduced. Moreover, the limited bandwidth of existing ATE results in increasingly longer test times due to the larger amount of test stimulus data that must be applied to larger networks. An added area of concern is the time required to retrieve test data from archival storage, transfer it to the ATE, and load the data into the scan buffer memory. Combined, these trends contribute to a continuous degradation of throughput and productivity of the installed ATE with every new technology generation. It, further, results in a higher test cost due to longer test times and/or the need to invest in additional expensive ATE to increase the capacity of the manufacturing test floor. Further discussion of this problem can be found in the following two related articles:

"Bit-Flipping BIST" by Hans-Joachim Wunderlich and Gundolf Kiefer, published in ICCAD '96, pp. 337–346, 1996; and "Synthesis of Mapping Logic for Generating Transformed Pseudo-Random Patterns for BIST", by N. A. Touba and E. J. McCluskey, published in 1995 International Test Conference, pp. 174–682.

In both articles, the relative sparseness of care-bits for synthesizing custom logic that modifies data streams generated by an LFSR as needed for reconstructing the correct care-bit values is exploited. The disadvantage of these approaches is that the resulting custom logic is different for each design and constitutes an additional, unpredictable hardware overhead.

The present invention is based on a test data encoding concept published at the 1991 European Test Conference by Bernd Koenemann, in an article entitled "LFSR-Coded Test Patterns for Scan Designs", pp.237–242. Several extensions of this scheme were subsequently published in academia and industry, e.g., by N. Zacharia et al., "Two-Dimensional Test Data Decompressor for Multiple Scan Designs", 1996 International Test Conference, pp. 186–194; and by Pieter M. Trouborst, "LFSR Reseeding as a Component of Board Level Test", 1996 International Test Conference, pp. 58–96.

In all prior approaches, a Linear Feedback Shift Register (LFSR) within the IC under test is used as a means for test data expansion. The disadvantage of these approaches is that the width of the on-chip LFSR determines how many seed bit values are available as independent variables for encoding each test. Hardware cost considerations limit a reasonable width of the LFSR, which in turn limits the number of care bits that can be successfully encoded in each test. The methods are also sub-optimal from a semiconductor manufacturing test point of view in that they do not exploit the available bandwidth of the ATE. The ATE loads a seed into the LFSR at the beginning of each test but, then, essentially sits idle for many scan clock cycles until the test has been expanded and shifted into the internal scan chains inside the IC under test.

Attempts have been made to store and generate macros for built-in test pattern generation to improve the number of independent variables that can be loaded into the IC under test by suggesting how denser RAM/ROM structures can be used for variable storage in conjunction with traditional LFSRs. This approach, however, still requires that the encoded data be first downloaded into the circuit under test and then expanded internally while the expensive ATE sits idle, clearly a serious drawback.

Only recently, new methods have appeared wherein the independent variable data can be provided to an on-chip decoder from the ATE in real-time. One of such approaches is described by Abjhijit Jas et al., "Scan Vector Compression/Decompression Using Statistical Codes", VTS'99, pp. 114–120, 1999, which uses statistical coding techniques that are much more complex than the linear Boolean codes, which is much simpler to use and to implement and which is the subject of the present invention.

OBJECT OF THE INVENTION

Thus, it is an object of the invention to provide a low-cost test pattern decoding means that can be cost-efficiently integrated into each IC under test.

It is another object of the invention to use a design-independent low-cost decoding network that exploits the existing ATE buffer memory rather than on-chip hardware to control the care-bit value generation.

It is still another object of the invention to establish a simple test pattern encoding scheme that permits preparing test data in a properly encoded form that is compatible with the decoding means provided by the decoding network.

It is a further object of the invention to overcome the above stated limits of previous methodologies by allowing the ATE to continuously supply independent variable data while the internal scan chains are shifted.

SUMMARY OF THE INVENTION

The invention solves both, the total test data volume problem and the test time problem, by integrating a novel real-time test data decoder in each IC. Test data is stored on the ATE and delivered to the IC under test in a highly compact, encoded format that is expanded in real-time within the IC under test.

The proposed novel decoder circuitry consists of a particularly simple and small logic network that connects the narrow scan data interface of the ATE to a much larger number of internal scan chains inside the IC under test. For example, a decoder network with an amplification factor of 8 expands the 32-bit encoded data words from the ATE into 256-bit wide decoded data words that are shifted into 256 internal scan chains in parallel. The amount of encoded data supplied by the ATE to completely load the scan chains consequently is much smaller (e.g., up to a factor of 8) than the total number of register elements in the scan chains. Because the number of scan chains inside the IC can be made so much larger than the width of the ATE's scan interface, it is possible to proportionally reduce the length of the longest scan chain. The net result is a commensurate reduction of test time (e.g., up to a factor of 8).

For the complete methodology, an equally simple encoding algorithm allows Automatic Test Pattern Generation (ATPG) software to organize the test data in appropriately encoded form for use with the proposed decoder hardware. The key contributing characteristic of automatically generated scan tests is that only a very small subset of register element data values needs to be at a specific "care" value for any given test, while the vast majority of data values are "don't cares". The proposed encoding algorithm exploits both, the sparseness of the "care" values and the freedom to arbitrarily assign "don't care" values, to achieve a significant reduction in the encoded data without losing test coverage.

Despite being simple and requiring a uniquely small circuit overhead in the ICs under test, the disclosed method achieves a large reduction in ATE-resident test data volume and test time when compared to current practices of traditional scan test methods. Because the proposed decoding is performed on the IC under test, no special ATE hardware or software features are needed. The disclosed invention, thus, extends the useful lifetime, and vastly improves the productivity of lower-cost and existing ATE equipment. Since the ATE consumes a considerable portion of semiconductor manufacturing capital investment and operating costs, the invention has the potential of measurably improving the profitability of manufacturing semiconductor products.

In a first aspect of the invention, there is provided a method for testing logic products consisting of a plurality of internal scan chains wherein the number of the internal scan chains exceeds the number of primary inputs available for loading data into the scan chains, the method including the steps of: a) inserting a combinatorial or sequential logic network between the primary inputs and the inputs of the scan chains, the logic network receiving input data words having a width corresponding to the number of primary inputs, the logic network further expanding the input data words into output data words having a width that corresponds to the number of the internal scan chains; b) constructing each input data word such that the values of a predetermined set of bits in each output data word exactly match predetermined values established for achieving improved test coverage; c) supplying a plurality of input data words to the primary inputs; d) from each such input data word, deriving one or several wider output data words; e) loading the bit values of each the wider output data word into register elements of the internal scan chains while data previously loaded into the scan chains is shifted forward inside the scan chains; and f) supplying as many of the input data words to the primary inputs to generate as many derived expanded data words to be loaded into the internal scan chains as needed to achieve an improved test coverage.

In a second aspect of the invention, there is provided an apparatus for testing logic products containing a plurality of internal scan chains wherein the number of the internal scan chains exceeds the number of primary inputs available for loading data into the scan chains, the apparatus including: a) a combinatorial or sequential logic network positioned between the primary inputs and the inputs of the scan chains, the logic network expanding input data words having a width corresponding to the number of the primary inputs converts the input data words into expanded output data words having a width that corresponds to the number of the internal scan chains; and b) coupled to the internal scan chains, registers loaded with bit values of each the expanded output data words while data previously loaded into the scan chains shifts forward within the scan chains by one bit position, wherein a first plurality of the input data words supplied to the primary inputs generates a second plurality of expanded data words that are loaded into the internal scan chains to achieve a predetermined test coverage.

BRIEF DESCRIPTION OF THE DRAWINGS

The accompanying drawings which are incorporated in and which constitute part of the specification, illustrate presently a preferred embodiment of the invention and, together with the general description given above and the detailed description of the preferred embodiment to be given below serve to explain the principles of the invention.

FIG. 5 shows the scan chains with decoded data (Note: the encoded data is shown on the right), and further illustrates that all care-bit values are covered properly in the decoded data even if some bit values in the encoded data are left unspecified.

DESCRIPTION OF A PREFERRED
EMBODIMENT OF THE INVENTION

The integrated logic network (i.e., decoder) makes it possible to replace the fully expanded, ready-to-use test stimulus data used for conventional scan testing in the ATE with a more compact encoded data. Only the much smaller amount of encoded data is stored in the archival storage from where it is transferred and loaded into the ATE buffer memory without prior decoding the data. The ATE delivers the test stimulus data in its compact encoded form to the scan PIs of the circuit under test without any additional data transformations performed by the ATE. No special software and/or hardware support is required by the ATE. The encoded data is expanded in real-time by the integrated decoder within the circuit under test and a fully decoded test stimulus data word is loaded into the internal scan chains with every scan clock cycle.

Figure 1:
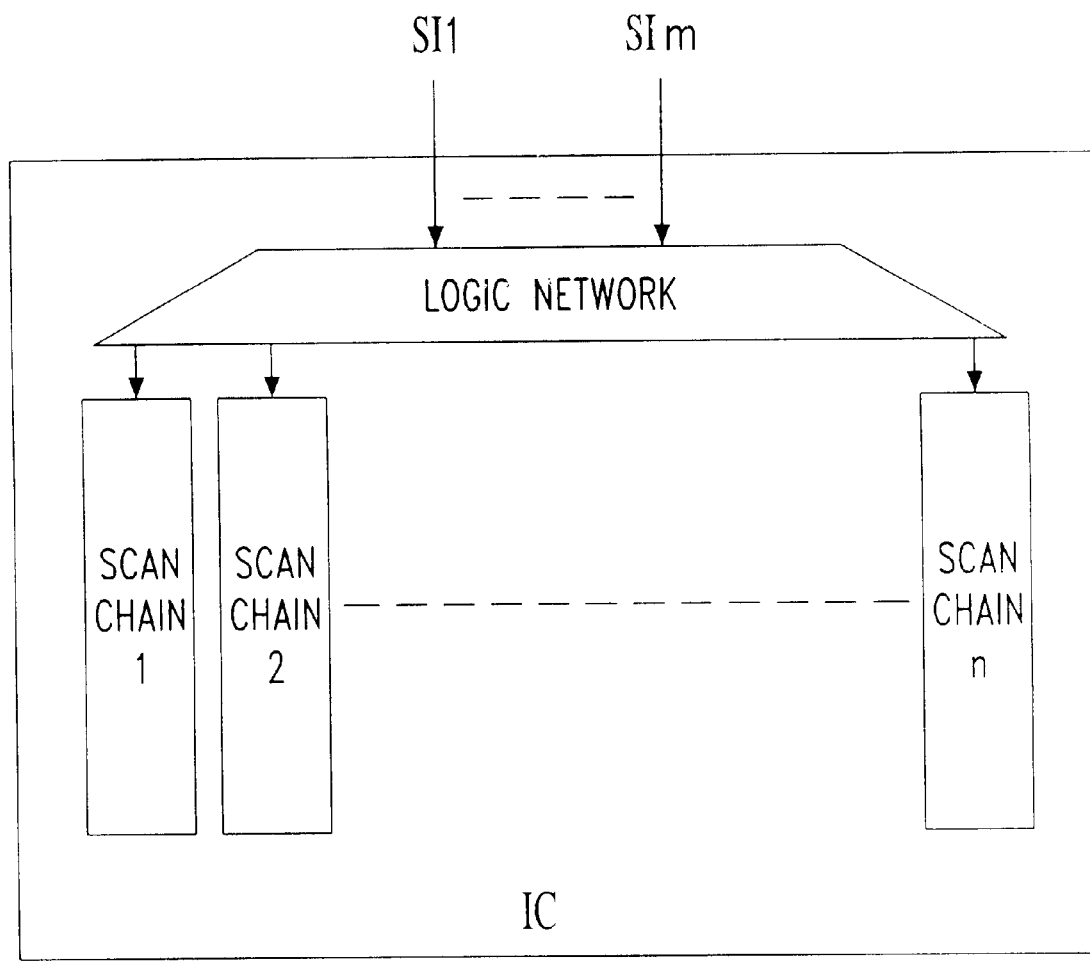
FIG. 1 shows the scan interface with the integrated logic network, in accordance with present invention, wherein the number of scan chains exceeds the number of product primary inputs.

The integrated decoder network to be described hereinafter is inserted within the circuits under test between a certain number of external scan Primary Inputs (scan PIs) and the local inputs of a much larger number of internal scan chains. FIG. 1 illustrates how the integrated decoder network is incorporated into an IC between the scan PIs and the inputs of internal scan chains. The number of external scan PIs is determined by ATE considerations, in particular by the maximum number of inputs that can be serviced in parallel by the ATE's architecture. The ATE is synchronized to the scan clocks and provides a new encoded input data word to the scan PIs at every or some pre-determined scan clock cycles. The decoding network generates a wider fully decoded data word for the scan chain inputs at every scan clock cycle.

The decoding network is designed and operated such that it establishes a known Boolean relationship between the encoded input values received from the ATE and the derived fully decoded output values. More specifically, the logic bit value thus seen by each internal scan chain input is formed by a Boolean expression that combines the values of a subset of bits in the encoded data words applied to the scan PIs. Preferably, although not necessarily, the respective Boolean expression characterizing each internal scan chain input combines a different subset of scan PI values. It is not considered essential, although it is plausible, that the decoder uses different types of logic operators for different scan chains.

Figure 2:
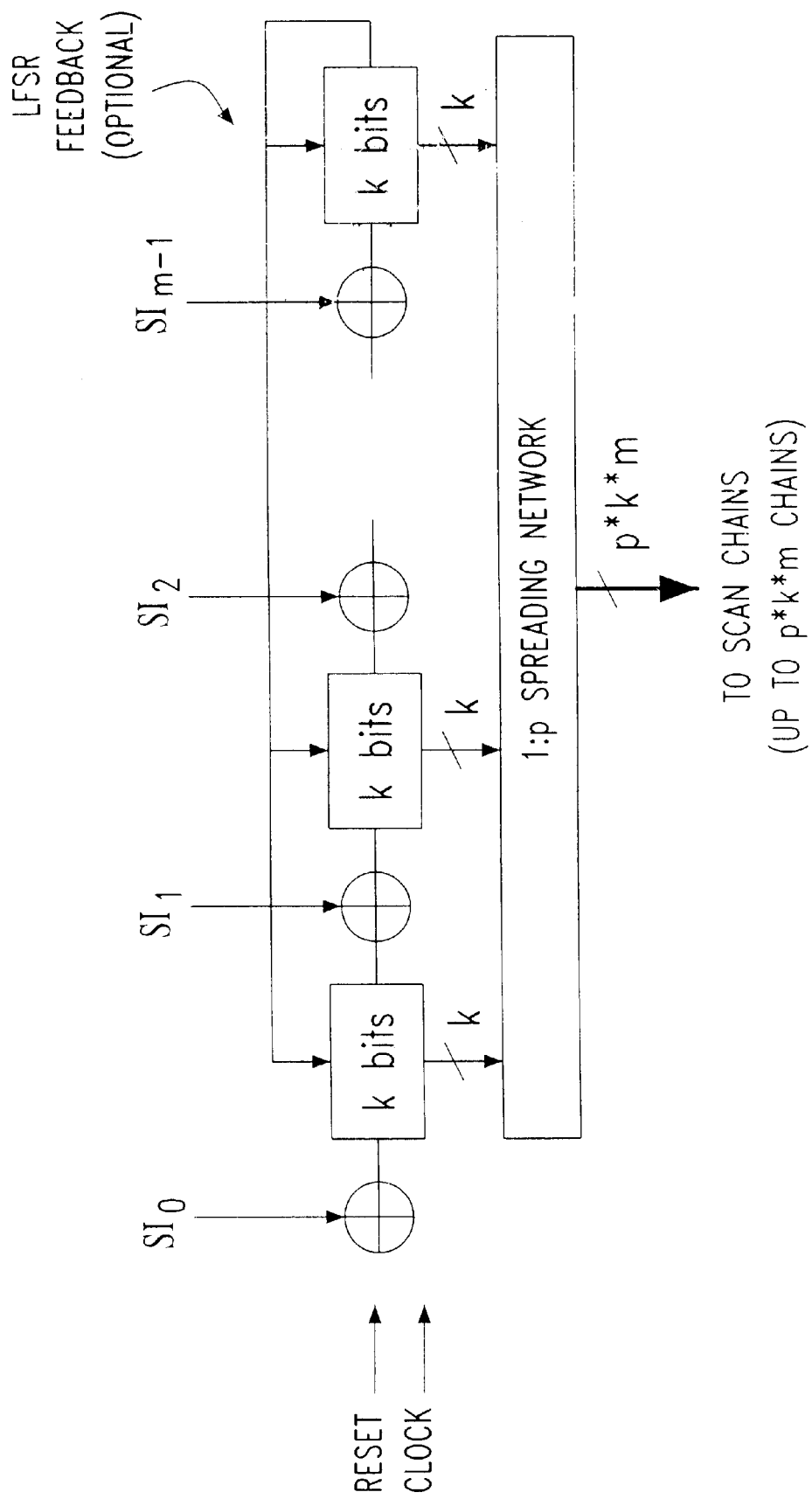
FIG. 2 shows a preferred embodiment of the architecture of the logic network.

The architecture of a possible embodiment of a decoding network is shown in FIG. 2. The network consists of a Linear Feedback Shift Register (LFSR) of length m*k with m external inputs, k register bits for each external input, and a 1:p spreading network connected to the m*k LFSR outputs. The spreading network itself consists of Exclusive-OR (XOR) gates having p*k*m outputs to feed up to p*k*m internal scan chains. Optional LFSR feedbacks are constructed according to well known techniques, using XOR gates, as needed to combine data.

The external data is entered into the LFSR using XOR gates, as illustrated in FIG. 2. A reset input is provided to initialize the LFSR to a fixed initial state. The LFSR is updated to a new state in response to a clock signal. To operate the decoding network for the purpose of decoding scan test patterns, the LFSR is reset to its initial state at the beginning of the test, and the clock is synchronized to the scan clock(s) for the internal scan chains. The state of the LFSR is, thus, updated for every scan clock cycle. The ATE provides encoded scan test data to the external inputs for each such clock cycle or for some subset of clock cycles. Due to the nature of the LFSR, the external data interface and the spreading network, each data bit value thus generated at the output of the spreading network in each clock cycle is an XOR-sum of a-subset of bit values in the initial LFSR state and bit values supplied from the ATE at the external inputs. The specific XOR sum configuration for each derived bit value in each clock cycle can be determined in advance by performing a symbolic simulation of the decoding network operation. How the XOR sums are made useful for scan testing is illustrated in an example described hereinafter.

In a related possible embodiment, a Cellular Automaton suitable for test pattern generation can be used in place of the LFSR, such as the one described by Peter D. Hortensius in the IEEE Transactions on Computer-Aided Design of Integrated Circuits and Systems, Vol. 8, No. 8, August 1989, pp. 842–859.

In a simplified embodiment, the decoding network is purely combinatorial and consists of only the spreading network constructed by way of XOR gates, such that each chain input receives the XOR sum of a different subset of scan PI bit values. The Boolean expressions associated with the scan chain inputs are then linear with respect to the XOR function. The overhead for the XOR network can be kept small by limiting the number of scan PIs seen in each scan chain.

Figure 3:
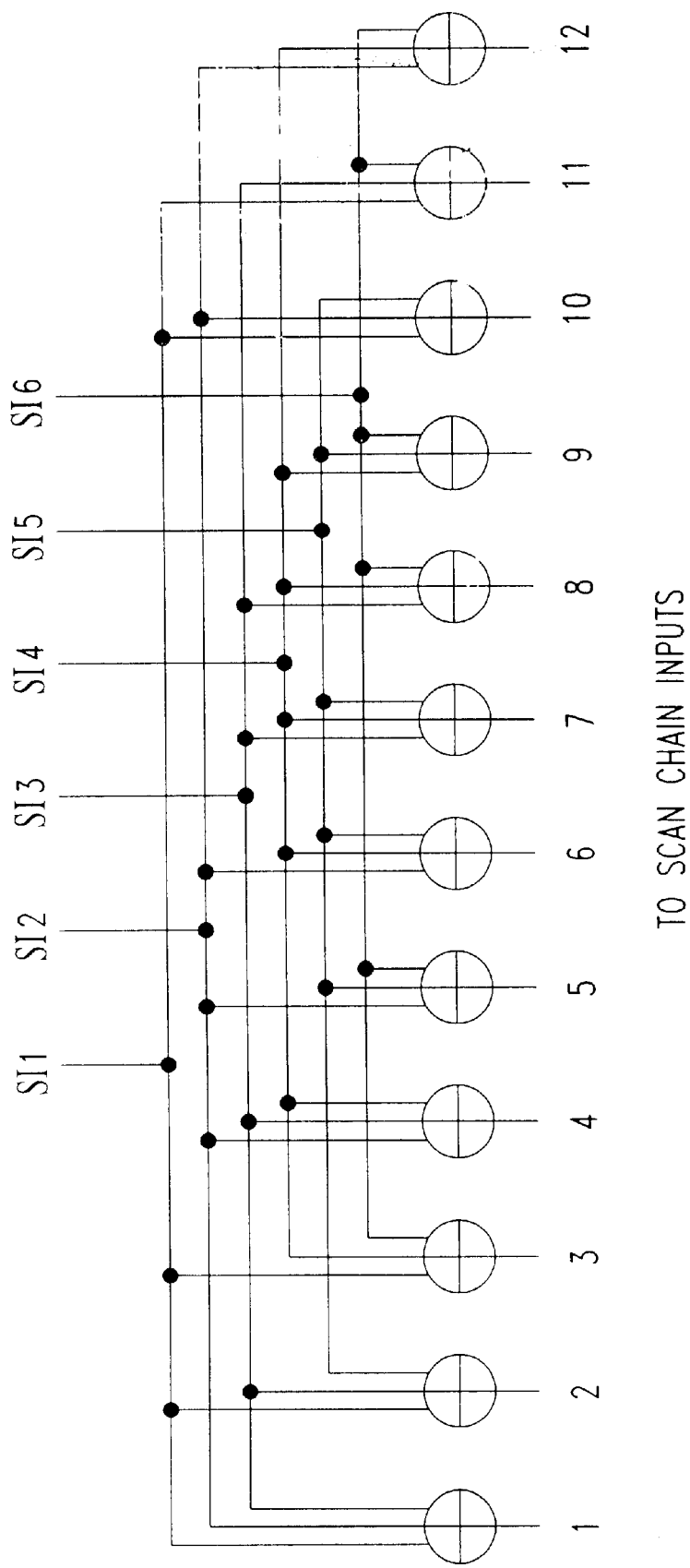
FIG. 3 illustrates a simple combinatorial logic network using 3-way exclusive-OR gates (XORs).

A small 2x decoding network example that translates data from six scan PIs into inputs for twelve scan chains using 3-way XORs for each chain is shown in FIG. 3. This small network is used for illustrative purposes only. A more realistic example for large ICs and typical ATE interfaces would be a -decoding network that connects 32 scan PIs to the inputs of 256 or even 512 internal scan chains, using 3-way or 4-way XORs for each chain. This implies that each scan chain receives a different XOR-sum of three or four scan PI values.

The ATE supplies a new data word to the scan PIs for each scan clock cycle, and the decoding macro (network) decodes the received data word into a wider data word for the scan chain inputs. In response to the scan clock cycle, data already stored in the scan chains is shifted by one bit position away from the scan chain inputs. Further, the decoded wide data word bits from the decoding macro (network) is loaded into the respective first register element of each scan chain. New input data is thus provided and decoded with each subsequent scan clock cycle. As a result, data loaded into scan chain register elements at different shift distances from the scan chain inputs is decoded from different input data words and, therefore, are independent of each other. Since all register elements within a single scan chain are at various distances from the scan chain input, they receive independent values. The values loaded into the register elements within different scan chains at the same shift distance from the inputs are decoded from the same input data word and, therefore, are interdependent.

The decoding network example shown in FIG. 3 establishes the following linear Boolean relationships between the internal scan chain inputs and the scan PIs:

TABLE 1

Decoding Mapping Formulas for FIG. 1 (Note: + stands for XOR)

| | | |
|---|---|---|
| Scan Chain 1 | = | SI1 + SI2 + SI3 |
| Scan Chain 2 | = | SI1 + SI3 + SI5 |
| Scan Chain 3 | = | SI1 + SI4 + SI6 |
| Scan Chain 4 | = | SI2 + SI3 + SI4 |
| Scan Chain 5 | = | SI2 + SI5 + SI6 |
| Scan Chain 6 | = | SI2 + SI4 + SI5 |
| Scan Chain 7 | = | SI3 + SI4 + SI5 |
| Scan Chain 8 | = | SI3 + SI4 + SI6 |
| Scan Chain 9 | = | SI4 + SI5 + SI6 |
| Scan Chain 10 | = | SI1 + SI2 + SI5 |
| Scan Chain 11 | = | SI1 + SI3 + SI6 |

Test data for scan-based designs is typically generated by a so-called Automatic Test Pattern Generation (ATPG) software. ATPG tools generally operate on a gate-level netlist and an associated list of model faults of the circuit under test. Each fault defines some localized logic excitation and propagation conditions that the ATPG tool must produce for certain nets in the netlist. A fault is declared detected if the ATPG tool succeeds in finding data values that can be loaded into the scan chains such that the derived local net values meet all the excitation and propagation criteria for the targeted fault.

It is an important characteristic of the data values generated by typical ATPG tools for testing a single fault, that only a small subset of the large number of scan chain elements be loaded with specific values to achieve the excitation and propagation criteria. This subset of scan register elements is referred to as the subset of care-bits for the fault test. The values loaded into the remaining scan chain elements do not contribute to the excitation and propagation of the selected fault. Hence, they can be loaded with arbitrary values without invalidating the test for the targeted fault. The subset of scan chain elements that does not require specific values is referred to as the subset of don't-care-bits for the fault test.

Large digital circuits today contain millions of logic gates and tens to hundreds of thousands of scan chain elements. The number of care-bits for a typical fault test, by contrast, tends to be a few tens for the vast majority of faults. Some extreme fault tests may require a few hundred care-bits, but those cases tend to be rare. In all practical cases, the number of care-bits for any single fault test is found to be much smaller than the total number of scan register elements in large digital circuits.

To improve the efficiency of each test pattern, modern ATPG (Automatic Test Pattern Generator) tools attempt to merge the tests for several faults into a single test pattern. This is possible as long as no conflict exists between the care-bit values from the same scan register element. The resulting merged test pattern contains a larger number of care-bits for several tests than any constituent single fault test. It is found in practice, however, that the vast majority of scan register elements in large digital circuits remain don't-care-bits even after merging, while only a small minority are care-bits which must receive specific values. The ATPG tools thereby establish a set of predetermined care-bit values that must be matched exactly, and a second set of bit values that can be filled in arbitrarily. For use with the decoding network, the tests must be encoded in a way that is consistent with the logic properties of the decoding network.

The proposed encoding method exploits the combined effect of sparse care-bits and the ability to assign arbitrary values to the don't-care-bits. To be useful, the encoding algorithm must ensure that the decoder correctly reconstructs all care-bit values, while filling the don't-care-bit positions with predictable, although arbitrary values. The correct relationship between the encoded and decoded bit values is determined by Boolean expressions that characterize the decoding network. The complete set of care-bit values for a given merged or unmerged test pattern thus creates a set of Boolean equations with the encoded bit values as independent variables. Any solution of the complete set of care-bit equations is a suitable encoded test pattern that will produce the same correct care-bit values after decoding. Different solutions, if they exist, differ only in the don't-care-bit values. The care-bit equations are particularly simple for linear decoding networks, such as the one shown in FIG. 3.

Figure 4:
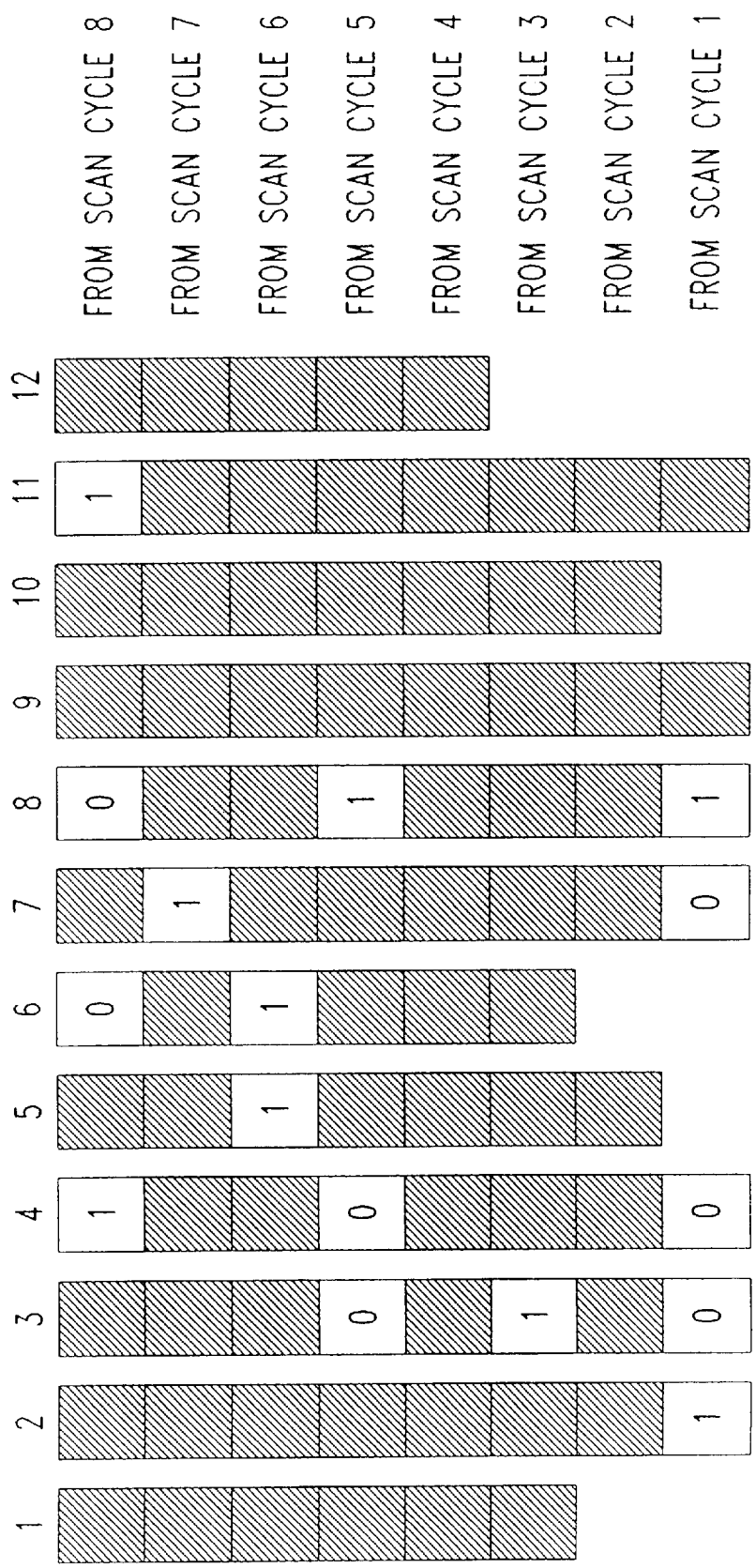
FIG. 4 shows an example of a test vector, highlighting cells without data (i.e., don't-care bits).

Referring now to FIG. 4, there is shown an example of a test vector applicable to 12 short scan chains, i.e., 8 register elements or less per chain, driven by the decoding network shown in FIG. 3. Eight scan cycles are required to completely load the scan chains with test data. The data provided in the first scan cycle (scan cycle 1) is shifted down the furthest within the scan chains, while the data provided in the last scan cycle (scan cycle 8) remains closest to the scan chain inputs. The encoded data provided by the ATE in each scan cycle must generate the correct care-bit values in the scan register elements associated with the respective scan cycle. Each horizontal row of scan register elements in the figure is loaded in a particular scan cycle, as specified on the right hand side of the figure.

The empty cells shown in FIG. 4 designate don't-care-bit positions, while the cells with data indicate care-bit positions and their associated data values. By way of example, data supplied from the ATE in scan cycle 8 must generate a 1 in chains 4 and 11, and a 0 in chains 6 and 8. The values generated for the other scan chains in scan cycle 8 are don't-care-bits. For scan cycle 7, a 1 is needed in scan chain 7, while all other chains are don't-care-bits for that scan cycle.

Each care-bit value sets up an equation for the data that must be supplied from the ATE in the respective scan cycle.

If several care-bit values are associated with the same scan cycle. Then, a set of equations is derived for the input data for that particular scan cycle. For instance, 4 care-bit values are associated with scan cycle 8. The associated set of 4 equations can be derived from the care bit values and the Boolean relationship for the decoding network shown in Table 2.

TABLE 2

Care-Bit Value Equations for Scan Cycle 8

| | | | |
|---|---|---|---|
| Scan Chain 4: | SI2 + SI3 + SI4 | = | 1 |
| Scan Chain 6: | SI2 + SI4 + SI5 | = | 0 |
| Scan Chain 8: | SI3 + SI4 + SI6 | = | 0 |
| Scan Chain 11: | SI1 + SI3 + SI6 | = | 1 |

Any combination of input values that simultaneously solves the four equations shown above will generate the correct care bit values in chains 4, 6, 8, and 11. The input vector {SI1, SI2, SI3, SI4, SI5, SI6}={011100} is one such solution, and the input vector {110010}, a second answer.

Scan cycle 7 only generates a single equation, because only one care-bit value is needed in scan chain 7 for that scan cycle. The equation for scan chain 7 only involves the input variables SI3, SI4, and SI6 (see Table 1). The other three input variables do not contribute to the single care-bit value and, hence, can be chosen freely. The input vector {SI1, SI2, SI3, SI4, SI5, SI6} ={xx111x}, wherein x denotes an unspecified value, is one solution for the single care-bit equation associated with scan cycle 7. The care-bit values for the other scan cycles generate similar sets of equations that must be solved for each scan cycle.

Figure 5:
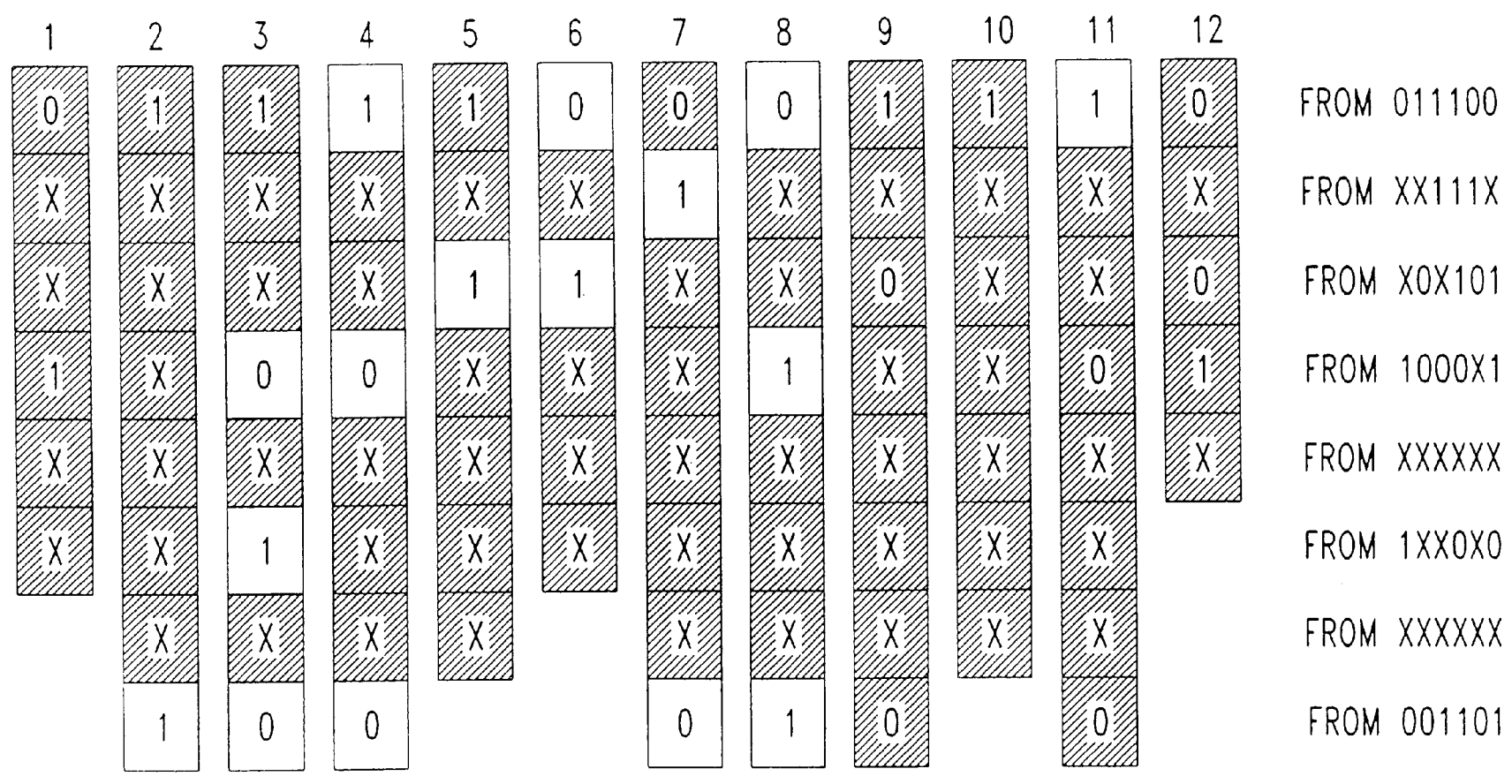

FIG. 5 illustrates a particular set of solutions for all 8 scan cycles that results in proper values for all care bit positions. Shown therein, are all the care-bit values which are covered properly in the decoded data even if some bit values in the encoded data are left unspecified. Alternatively, the encoding algorithm still has a degree of freedom in assigning values to the unspecified bits in the encoded data. In the example, only 27 out of 48 encoded data bits have specified values that generate the correct values for 16 care-bits embedded within 87 bits of decoded data. Furthermore, the set of care-bit equations for a particular scan cycle may have multiple solutions with different specified values. It has been found advantageous in traditional ATPG algorithms to use pseudo-random values for the don't-care-bits. These pseudo-random values help to detect other non-targeted faults and non-modeled defects. Therefore, it is suggested that the encoding algorithm also use pseudo-random values whenever there exists a freedom to choose a value. This makes it more likely that the don't-care-bits in the decoded patterns are filled in a pseudo-random manner that increases the effectiveness of the tests.

A sequential decoding network as the one shown in FIG. 2 generates equations for the care-bit values similar to the combinational implementation shown in FIG. 3. The main difference is that in the sequential implementation, input variables from all previous scan cycles influence the values that are derived at any given scan cycle. For the combinational implementation, by contrast, only inputs from the current scan cycle need to be considered.

It must be pointed out that the described encoding method has certain limitations. The example shown in FIG. 3 maps 6 encoded bits into 12 decoded bits. Hence, only 64 out of a total of 4096 possible 12-bit combinations can be generated by the decoding logic. This restriction occasionally makes it impossible to encode all care-bits for a given test. Since the data values within each horizontal row scan chain elements in FIG. 4 and FIG. 5 are derived from the same input data, only care-bits within the same horizontal row will cause such encoding problems. Data values in different horizontal rows are derived from an independent input data supplied at different scan cycles and, therefore, are independent of each other. Hence, the maximum number of care bits for any given test that are contained within one horizontal row of scan elements, the "horizontal spread" of the test is a cause of concern for the proposed method of encoding. The test shown in FIG. 4 has a horizontal spread of 5, because of the 5 care-bits that are contained in the bottom row of scan elements (i.e., the row associated with the data supplied in scan cycle 1). All other rows contain fewer care-bits.

Modern scan chain insertion and optimization tools tend to partition and connect scan chains based on clock domain association, logical affinity, and placement results. It can be expected that the care-bits of individual fault tests tend to predominantly, involving inputs to the logic cone immediately associated with the fault location. The inputs to this logic cone are most likely associated with a relatively small number of scan chains (because of logic affinity and placement). It is very unlikely that a test cube for a single fault test includes scan elements from many different scan chains spread all over the IC. Further, it must also be considered even less likely that the care-bits of a given test cube are all aligned within the same row of scan elements (i.e., same distance from the scan chain inputs).

While the invention has been described in terms of a single preferred embodiment, those skilled in the art will recognize that the invention can be practiced with changes and modifications, all of which are deemed to fall within the scope and the spirit of the appended claims.

What is claimed is:

1. A method for testing logic products containing a plurality of internal scan chains wherein the number of said internal scan chains exceeds the number of primary inputs available for loading data into the scan chains, the method comprising the steps of:

a) inserting a logic network between said primary inputs and the inputs of said scan chains, said logic network receiving input data words having a number of bits that corresponds to the number of said primary inputs;

b) expanding said input data words in said logic network into output data words having a number of bits that corresponds to said plurality of internal scan chains; and c) loading bit values of each of said output data words into register elements of said internal scan chains while data previously loaded into said scan chains is shifted forward inside said scan chains, thereby achieving an improved test coverage.

2. The method as recited in claim 1 wherein a) said logic network creates a predetermined logic relationship between each bit value of said expanded output data words and a subset of bit values of said input data words; and b) bit values of each said input data word are constructed such that bit values in each said expanded output data word match predetermined bit values established for achieving an improved test coverage.

3. The method as recited in claim 2 wherein a) said predetermined bit values are established by Automatic Test Pattern Generation software; and b) said input data words are constructed by said Automatic Test Pattern Generation Software such that bit values in each said expanded output data word match said predetermined bit values established for achieving an improved test coverage.

4. The method as recited in claim 1 wherein
a) each bit value of each of said output data words provided by said logic network is an exclusive-or sum of a subset of bit values of said input data words; and
b) bit values of each said input data word are selected such that subsets of bit values in each of said output data words match predetermined bit values established for achieving said improved test coverage.

5. The method as recited in claim 1 wherein said logic network is comprised of combinatorial circuits.

6. The method as recited in claim 1 wherein
a) each input data word has a number of bits corresponding to the number of said primary inputs and is translated by said combinatorial logic network into an output data word having a number of bits corresponding to the number of said internal scan chains;
b) bit values in said output data word are loaded into register elements that are coupled to said internal scan chains while data loaded into said scan chains is shifted forward; and
c) plural ones of said input data words supplied to said primary inputs produce plural data words that are loaded into said internal scan chains to achieve said improved test coverage.

7. The method as recited in claim 1 wherein said logic network is comprised of exclusive-or gates.

8. The method as recited in claim 1 wherein said logic network is comprised of a sequential deterministic Finite State Machine.

9. The method as recited in claim 1 wherein:
a) said logic network comprises a clocked pseudo-random pattern generator;
b) a state sequence of said pseudo-random pattern generator modified by said input data words; and
c) said expanded output data words formed by said logic network create linear combinations of state bit values of said pseudo-random pattern generator.

10. The method recited in claim 9 wherein said pseudo-random pattern generator is comprised of a linear feedback shift register and a network of exclusive-or gates.

11. The method as recited in claim 9 wherein said pseudo-random pattern generator is comprised of a cellular automaton and a network of exclusive-or gates.

12. The method as recited in claim 1 further comprising the step of supplying as many of said input data words to said primary inputs to produce as many output data words to be loaded into said internal scan chains.

13. The method as recited in claim 1 further comprising of supplying a smaller number of said input data words to said primary inputs and from each said input data word producing several output data words to be loaded into said internal scan chains.

14. An apparatus for testing logic products containing a plurality of internal scan chains wherein the number of said internal scan chains exceeds the number of primary inputs available for loading data into the scan chains, the apparatus comprising:

a) logic means positioned between said primary inputs and the inputs of said scan chains, said logic means expanding input data words having a number of bits corresponding to the number of said primary inputs into output data words having a number of bits that corresponds to the number of said internal scan chains; and
b) register means coupled to said internal scan chains, wherein said register means are loaded with bit values of each of said output data words while data previously loaded into said scan chains shifts forward within said scan chains by one bit position, thereby achieving an improved test coverage.

15. A computer program product comprising:
a computer usable medium having computer readable program code means embodied therein for testing logic products containing a plurality of internal scan chains wherein the number of said internal scan chains exceeds the number of primary inputs available loading data into the scan chains, the computer readable program code means in said computer program product comprising:
a) computer readable program code means for causing a computer to insert a logic network between said primary inputs and the inputs of said scan chains, said logic network receiving input data words having a number of bits that corresponds to the number of said primary inputs;
b) computer readable program code means for causing the computer to expand said input data words in said logic network into output data words having a number of bits that corresponds to said plurality of internal scan chains; and
c) computer readable program code means for causing the computer to load bit values of each of said output data words into register elements of said internal scan chains while data previously loaded into said scan chains is shifted forward inside said scan chains, thereby achieving an improved test coverage.

16. A program storage device readable by a machine, tangibly embodying a program of instructions executable by the machine, to perform method steps for testing logic products containing a plurality of internal scan chains wherein the number of said internal scan chains exceeds the number of primary inputs available for loading data into the scan chains, the method steps comprising:
a) inserting a logic network between said primary inputs and the inputs of said scan chains, said logic network receiving input data words having a number of bits that corresponds to the number of said primary inputs;
b) expanding said input data words in said logic network into output data words having a number of bits that corresponds to said plurality of internal scan chains; and
c) loading bit values of each of said output data words into register elements of said internal scan chains while data previously loaded into said scan chains is shifted forward inside said scan chains, thereby achieving an improved test coverage.

* * * * *